United States Patent [19]
Yoshida et al.

[11] Patent Number: 6,051,774
[45] Date of Patent: Apr. 18, 2000

[54] SOLAR BATTERY MODULE AND METHOD FOR PRODUCTION THEREOF

[75] Inventors: Shinichiro Yoshida, Namerikawa; Masahiro Yoshino, Kurobe, both of Japan

[73] Assignee: YKK Corporation, Tokyo, Japan

[21] Appl. No.: 09/129,087

[22] Filed: Aug. 5, 1998

[30] Foreign Application Priority Data

Aug. 5, 1997 [JP] Japan .................................. 9-209540

[51] Int. Cl.[7] .................................................. H01L 25/00
[52] U.S. Cl. .......................................... 136/244; 136/251
[58] Field of Search .................................... 136/244, 251

[56] References Cited

U.S. PATENT DOCUMENTS

| 3,837,924 | 9/1974 | Baron ........................................ 136/89 |
| 4,067,764 | 1/1978 | Walker et al. ........................... 136/251 |
| 5,733,382 | 3/1998 | Hanoka .................................... 136/251 |

FOREIGN PATENT DOCUMENTS

| 62-40873 | 8/1987 | Japan . |
| 4-42945 | 10/1992 | Japan . |
| 5-56672 | 8/1993 | Japan . |
| 2 032 508 | 5/1980 | United Kingdom . |
| 2 107 645 | 5/1983 | United Kingdom . |

*Primary Examiner*—Mark Chapman
*Attorney, Agent, or Firm*—Hill & Simpson

[57] ABSTRACT

A solar battery module having the component members thereof joined uniformly and sustaining no distortion in the surface thereof and a method for the production thereof are disclosed, The solar battery module comprises a solar battery unit and a honeycomb structure. The honeycomb structure comprises a honeycomb core possessed of a plurality of cells and a first surface panel and a second surface panel respectively joined to opposite opening sides of the honeycomb core. The second surface panel has a plurality of perforations communicating with cavities in the cells of the honeycomb core. The honeycomb core has at least a pair of perforations in the walls of each of the cells or is made of a porous material. The solar battery unit provided with a plurality of solar battery elements is mounted on the second surface panel of the honeycomb structure through the medium of a joining member and they are joined by application of heat and pressure while the air remaining in the gap therebetween is caused to flow into cavities of the honeycomb structure.

17 Claims, 4 Drawing Sheets

SOLAR BATTERY MODULE AND METHOD FOR PRODUCTION THEREOF

BACKGROUND OF THE INVENTION

1. Field of the Invention:

This invention relates to a solar battery module for converting the energy of sunlight into electrical energy and a method for the production thereof.

2. Description of the Prior Art:

The solar battery module is constructed by having a multiplicity of solar battery elements carried on a supporting base plate. When the sunlight impinges on the individual solar battery elements, the energy of the light which makes no contribution to the photoelectric conversion is accumulated in the form of heat to elevate the temperature of the solar battery elements and lower the efficiency of photoelectric conversion. Thus, various devices have been contrived for the material and construction of the supporting base plate for the purpose of conferring an improved ability to release heat on the supporting base plate.

As solar battery modules possessing supporting constructions which allow relatively satisfactory release of heat, such honeycomb structures as have solar battery elements joined thereto which are disclosed in Japanese Patent Publication No. 62-40,873, Japanese Utility Model Publication No. 4-42,945, and Japanese Patent Publication No. 5-56,672 have been heretofore known.

As means for producing these solar battery modules, a method which comprises setting a plurality of solar battery elements fast on the surface of a honeycomb structure through the medium of an adhesive agent and simultaneously pressing the plurality of solar battery elements thereby causing the adhesive agent to cure under the pressure and join them as disclosed in Japanese Patent Publication No. 62-40,873 and a method which comprises placing a sheet of thermoplastic resin on the surface of a honeycomb structure, setting a plurality of solar battery elements in place thereon, sequentially superposing a sheet of thermoplastic resin and a transparent PVF film in the order mentioned on the solar battery elements, setting the resultant superposed layers in a laminating device, heating them in a vacuum, and pressing them in a vacuum state thereby joining them as disclosed in Japanese Utility Model Publication No. 4-42,945 have been heretofore known to the art.

The former method of production, however, is deficient in operational efficiency of production because it entails a troublesome work of applying the adhesive agent to one after another of the plurality of solar battery elements.

The latter method of production effects the production more efficiently than the former method of production because it joins the plurality of solar battery elements to the surface of the honeycomb structure by the use of the sheet of thermoplastic resin. The latter method of production, however, suffers the ambient air to be locally entrapped between the sheet of thermoplastic resin and the surface of the honeycomb structure and the captive air to be eventually enfolded in the form of bubbles fast in the interface between the sheet of thermoplastic resin and the surface of the honeycomb structure. Since the sheet of thermoplastic resin and the surface of the honeycomb structure are not joined in the portions of the bubbles, the union thereof lacks uniformity. The portions of the sheet of thermoplastic resin corresponding to the bubbles are raised from the rest of the sheet and causes the solar battery element to form a distorted surface.

The plurality of solar battery elements, therefore, cannot be joined to the surface of the honeycomb structure in such a uniform state as allows the surfaces of the individual solar battery elements to form a uniform flat surface which is free from distortion.

SUMMARY OF THE INVENTION

The present invention, therefore, aims to provide a solar battery module and a method for the production thereof which are free from the problems of the prior art mentioned above.

The first aspect of the present invention is directed to a method for the production of a solar battery module. One embodiment of this method is characterized by comprising the steps of preparing a honeycomb structure possessed of a plurality of cavities by joining a first surface panel or plate and a second surface panel or plate to the opposite opening sides of a honeycomb core possessed of a plurality of cells, placing a solar battery unit through the medium of a joining member on the second surface panel of the honeycomb structure, and joining the second surface panel and the solar battery unit with the joining member by application of heat and pressure while causing the air present between the second surface panel and the solar battery unit to flow into the cavities of the honeycomb structure.

According to this method, the possibility of the ambient air being entrapped in the form of bubbles between the second surface panel of the honeycomb structure and the solar battery unit will be nil because the air present therebetween flows into the cavities while the surface panel and the solar battery unit are joined. As a result, the second surface panel and the solar battery unit are uniformly joined without forming any surface distortion to impart a flat surface to the produced solar battery module.

Preferably the air in the cavities is discharged to the exterior during the application of heat and pressure. According to this method, since the air which flows from the gap between the second surface panel and the solar battery unit into the cavities is discharged to the exterior, the possibility of the air being entrapped as bubbles between the second surface panel of the honeycomb structure and the solar battery unit can be precluded with increased infallibility and the surface panel and the solar battery unit can be joined with increased uniformity to impart a flat surface to the produced solar battery module.

Another embodiment of the method according to the present invention is characterized by comprising the steps of placing a honeycomb core possessed of a plurality of cells on a first surface panel or plate through the medium of a first sheet of adhesive agent in such a manner that one opening side of the honeycomb core is opposed to the first surface panel, placing a second surface panel or plate possessed of a plurality of first perforations on the honeycomb core through the medium of a second sheet of adhesive agent possessed of a plurality of second perforations, placing a solar battery unit on the second surface panel through the medium of a joining member, and joining the resultant superposed layers with the sheets of adhesive agent and the joining member by application of heat and pressure.

According to this method, the air intervening between the second surface panel and the joining member and the air intervening between the joining member and the solar battery unit are allowed to flow out through the first perforations and the second perforations into the cavities, the possibility of air being retained as bubbles between the interfaces will be nil. The production of the solar battery module is further attained with high efficiency because this production is effected at the same time that the honeycomb structure is produced.

Preferably the joining member mentioned above is in the shape of a sheet possessed of a plurality of third perforations so that the air which intervenes between the joining member and the solar battery unit flows infallibly through the third perforations into the cavities and the joining member and the solar battery unit can be joined with increased uniformity. In another preferred embodiment, the honeycomb core has at least a pair of perforations in the walls of each of the cells or is made of a porous material so that the air flowed into the cavities is discharged to the exterior.

In accordance with another aspect of the present invention, there is provided a solar battery module characterized by comprising a honeycomb structure possessed of a plurality of cavities and a solar battery unit joined to one opening side surface part of the honeycomb structure through the medium of a sheet-like joining member, wherein the honeycomb structure is provided in the surface part thereof contacting the joining member with a plurality of perforations adapted to connect an interface between the joining member and the surface part of the honeycomb structure with the cavities and having a structure adapted to allow passage of the ambient air into the cavities.

This construction allows the solar battery unit to be cooled because the ambient air flows into the cavities and the interface between the joining member and the surface of the honeycomb structure communicates through the plurality of perforations with the cavities. As a result, the energy of sunlight can be converted into the electrical energy with high an efficiency.

In a preferred embodiment, the sheet-like joining member is provided with a plurality of perforations adapted to connect an interface between the joining member and the solar battery unit with the cavities via the perforations in the surface part of the honeycomb structure.

This construction allows thorough radiation of heat from the solar battery unit even when the temperature thereof is elevated because the interface between the joining member and the solar battery unit communicates with the ambient air via the cavities. As a result, the energy of sunlight can be converted into the electrical energy with fully satisfactory efficiency and the decline of output of the solar battery elements due to the elevation of temperature thereof can be alleviated to a notable extent.

BRIEF DESCRIPTION OF THE DRAWINGS

Other objects, features, and advantages of the invention will become apparent from the following description taken together with the drawings, in which.

DETAILED DESCRIPTION OF THE PREFERRED EMBODIMENTS

First, the construction of a preferred embodiment of the solar battery module according to the present invention will be explained with reference to the accompanying drawings.

A solar battery module 1 comprises a solar battery unit 10 and a honeycomb structure 20. The honeycomb structure 20 functions as a suitable heat-radiating base plate because it has an extremely large surface area, possesses an effect of notably alleviating the decline of output of the solar battery elements due to an elevation of temperature thereof, and contributes to the decreasing of weight of the solar battery module as well.

Figure 1:
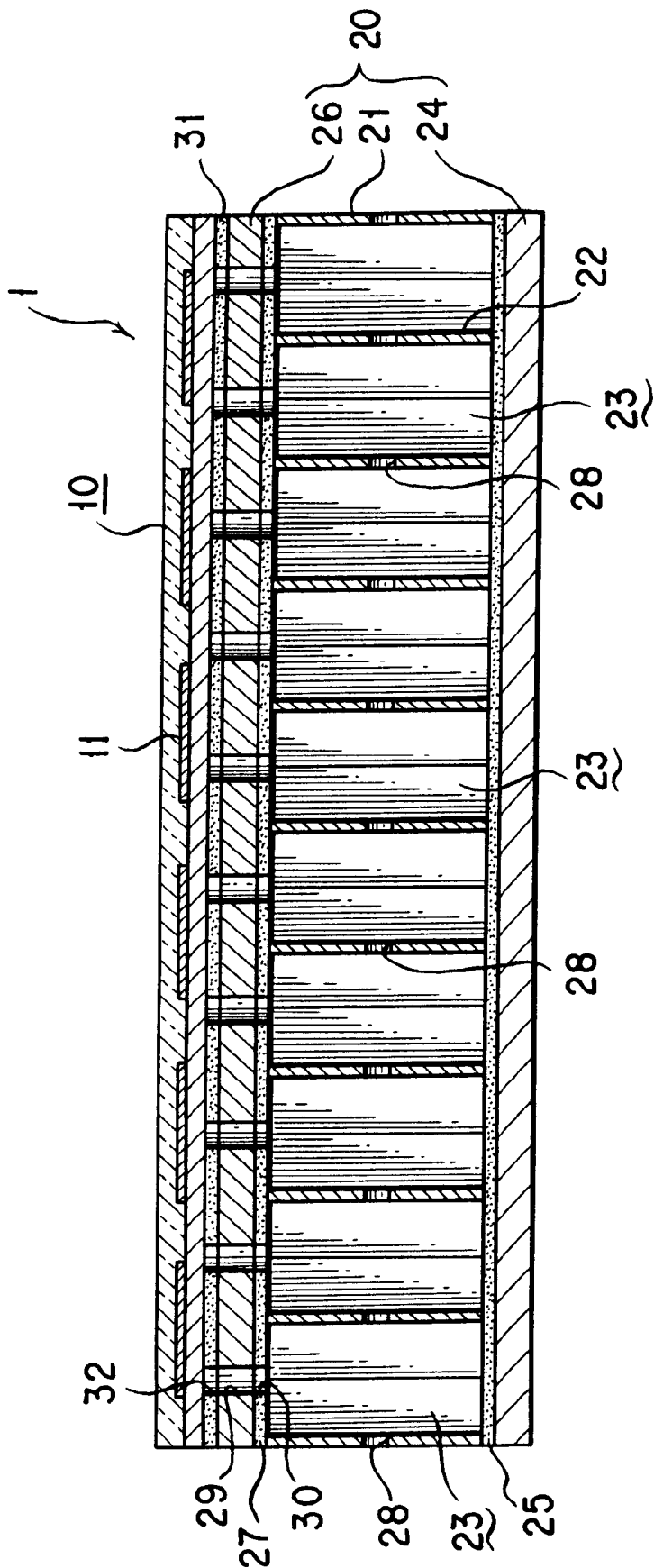
FIG. 1 is a cross section of one embodiment of the solar battery module of the present invention.
Figure 2:
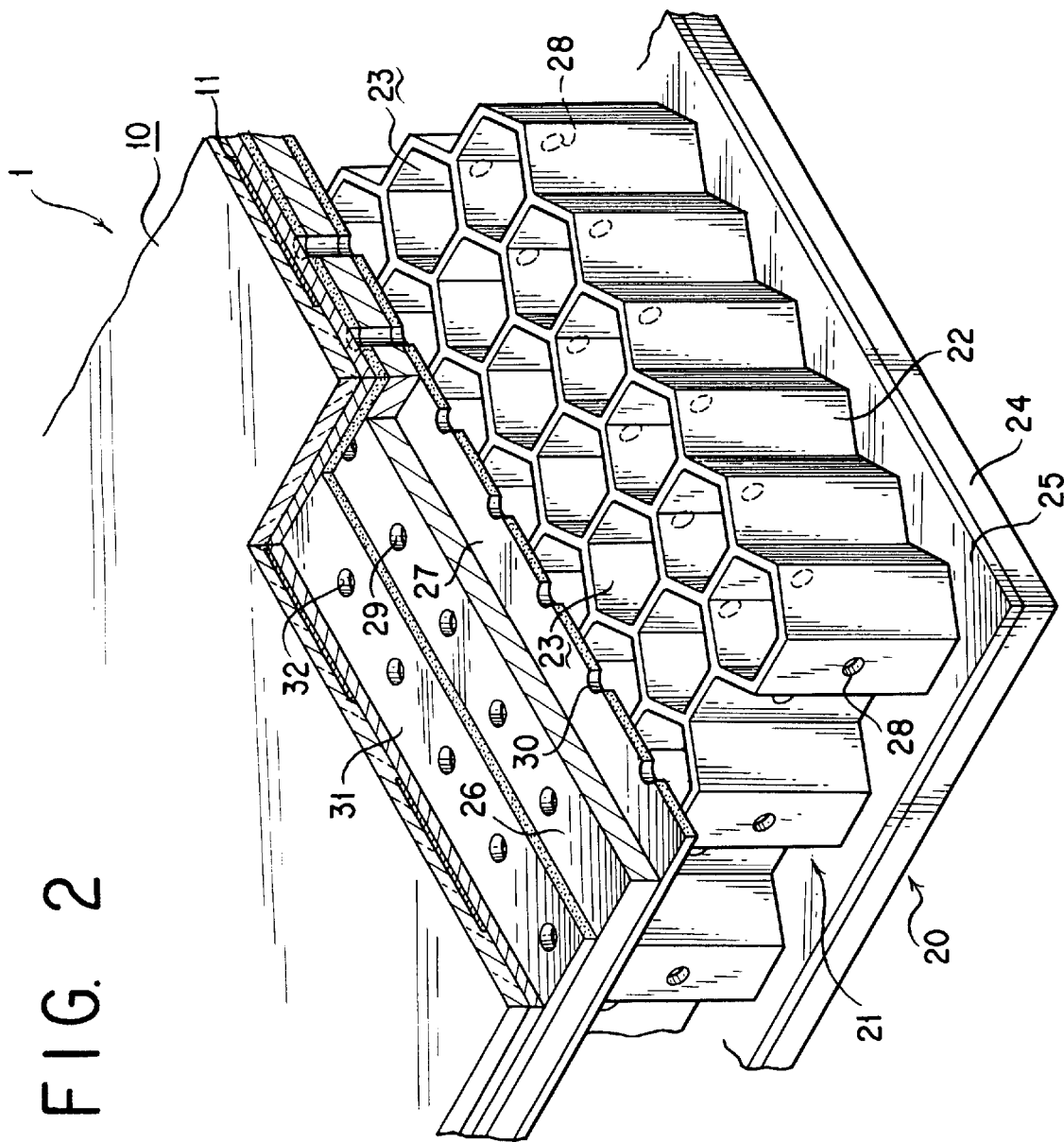
FIG. 2 is a partially cutaway perspective view of the solar battery module shown in FIG. 1.

The honeycomb structure 20, as illustrated in FIG. 1 and FIG. 2, comprises a honeycomb core 21 of aluminum consisting of a multiplicity of hexagonal columnar cells 22 each possessed of a cavity 23 of a hexagonal cross section, a first surface panel or plate 24 of aluminum joined through the medium of a first adhesive layer 25 to one opening side of the honeycomb core 21, and a second surface panel or plate 26 of aluminum joined through the medium of a second adhesive layer 27 to the other opening side of the honeycomb core.

The honeycomb core 21 has formed therein a plurality of perforations 28 intercommunicating the cavities 23 of the adjacent cells 22 and, at the same time, opening the cavities of the terminal cells into the exterior. The cavities 23 are adapted to admit the flow of the ambient air. In the illustrated embodiment, perforations 28 are formed one each in a pair of opposed lateral walls of each cell 22. Optionally, the honeycomb core 21 itself may be manufactured with a porous material pervious to the air and the honeycomb structure may therefore be enabled to admit the ambient air to the individual cavities 23 without requiring formation of perforations 28.

The adhesive layers 25 and 27 mentioned above are sheets of adhesive agent which are obtained by forming a thermoplastic material such as, for example, ethylene vinyl acetate, silicone-based adhesive agent, or epoxy resin adhesive agent in the shape of a sheet.

In the second surface panel 26 of the honeycomb structure 20 and in the adhesive layer 27 for joining the second surface panel 26 to the honeycomb core 21, a plurality of first perforations 29 and as many second perforations 30 are severally formed at matched positions so as to open the cavities 23 of the honeycomb structure 20 through the second surface panel 26 into the exterior (before adhesion of the solar battery unit).

To the second surface panel 26 (the surface part of the honeycomb structure 20 for supporting the solar battery unit 10), the solar battery unit 10 provided with a plurality of solar battery elements is joined with a sheet-like joining member or bonding material sheet 31. This bonding material sheet 31 is a product obtained by forming a thermoplastic material such as, for example, ethylene vinyl acetate, silicone-based adhesive agent, or epoxy resin adhesive agent in the shape of a sheet. This bonding material sheet 31 has formed therein third perforations 32 which are adapted to communicate with the first perforations 29 of the second surface panel 26.

Figure 3A:
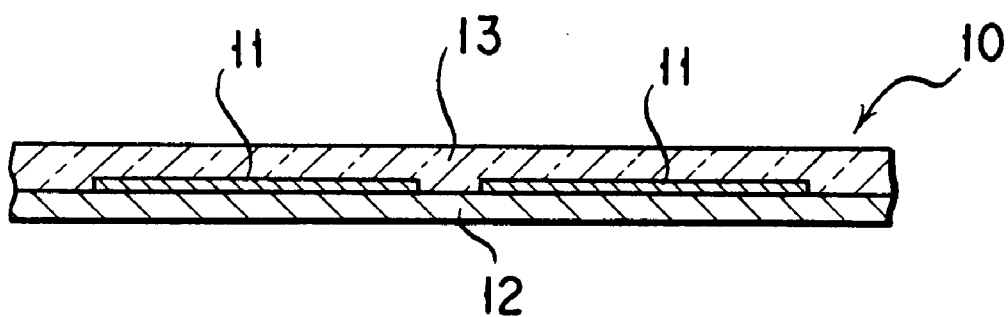
FIG. 3A and FIG. 3B are cross sections of two embodiments of the solar battery unit.
Figure 3B:
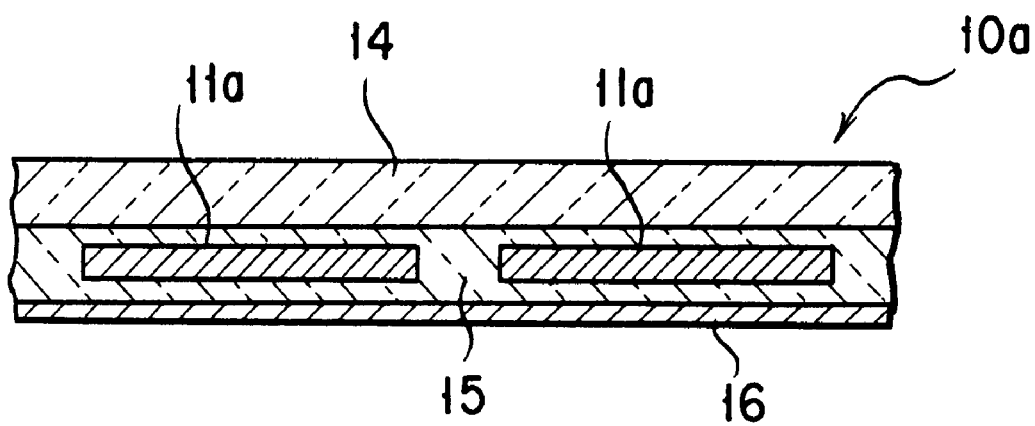

The solar battery unit 10 mentioned above is an elastic sheet which, as illustrated in FIG. 3A, is produced by joining a transparent protective layer 13 such as transparent protective sheet or transparent protective coating to a supporting sheet 12 such as a polymer resin sheet or a stainless steel or other metal sheet having formed thereon a plurality of thin-film solar battery elements or solar cells 11 in such a manner that the protective layer 13 may cover the solar battery elements 11. Otherwise, a solar battery unit 10a shaped like a panel may be used which, as illustrated in FIG. 3B, is produced by joining solar battery elements 11a through the medium of a transparent adhesive agent 15 to the rear surface of a transparent panel member 14 of glass or transparent resin and joining a backing sheet member 16 with an adhesive agent to the lower surfaces of the laminate.

According to the solar battery module 1 mentioned above, since the ambient air flows through the perforations 28 to the cavities 23 of the honeycomb structure 20 and further since the cavities 23 open into the joining surface of the solar battery unit 10 via the second perforations 30 of the adhesive agent layer 27, the first perforations 29 of the second surface panel 26, and the third perforations 32 of the bonding material sheet 31, the solar battery unit 10 is cooled with the ambient air flowing through the cavities 23 and the temperature of the solar battery unit 10 (the solar battery elements 11 and 11a) is consequently lowered and the energy of sunlight is converted into the electrical energy with high efficiency.

All the first, second, and third perforations 29, 30, and 32 are not required to communicate mutually. Several of the multiplicity of first, second, and third perforations 29, 30, and 32 may communicate mutually instead.

Further, since the bonding material sheet 31 has a small thickness and since it is uniformly joined to the solar battery unit 10, the temperature of the solar battery unit 10 can be lowered even when the bonding material sheet 31 would not have the third perforations 32 formed therein.

Now, the method for producing the solar battery module according to the present invention will be described below with reference to the drawings.

Figure 4:
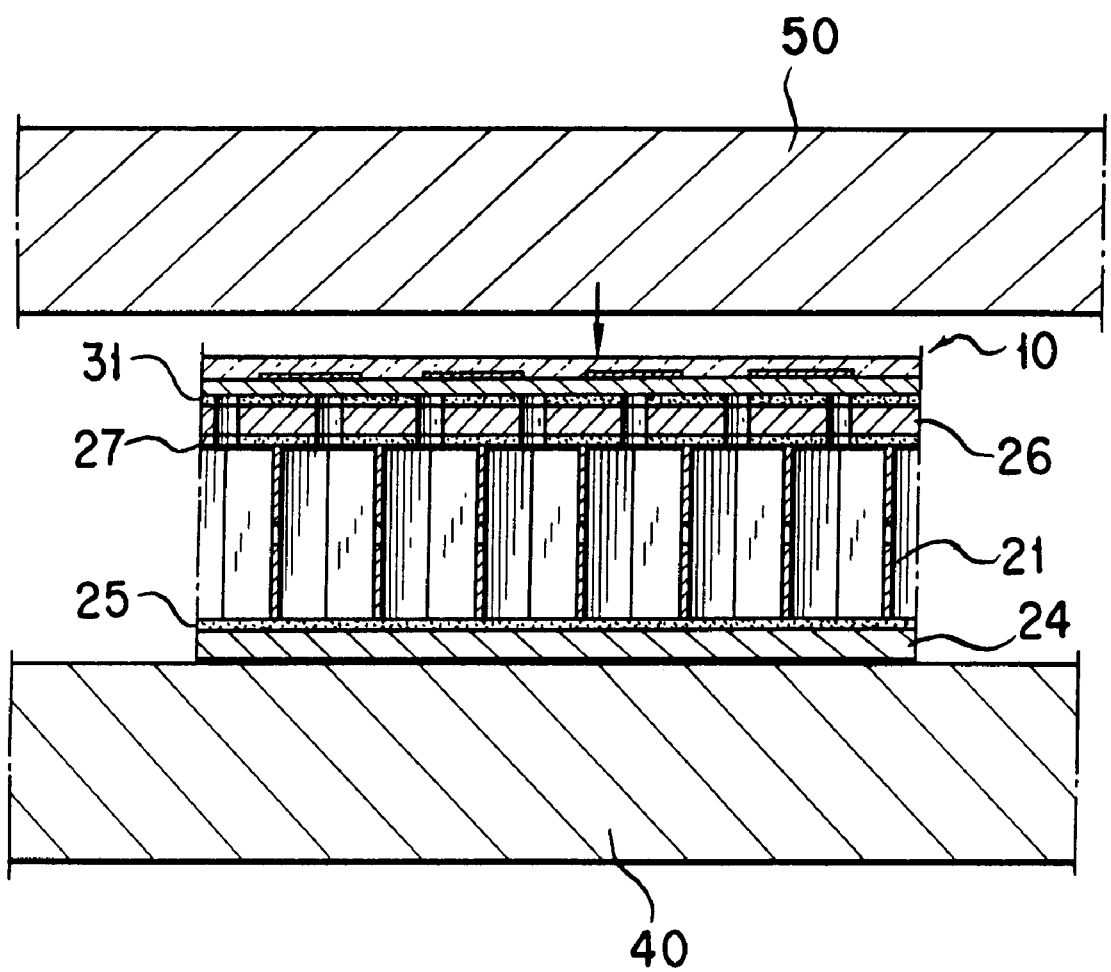
FIG. 4 is an explanatory diagram of a method for the production of the solar battery module according to the present invention.

On a lower die 40 of a pressing machine, the first surface panel 24, first adhesive agent layer 25, honeycomb core 21, second adhesive agent layer 27, second surface panel 26, bonding material sheet 31, and solar battery unit 10 are sequentially superposed in the order mentioned as illustrated in FIG. 4.

Subsequently, an upper die 50 is lowered until it nips the superposed components mentioned above in cooperation with the lower die 40 and the nipped components are heated and pressed for lamination. This lamination is implemented by means of a hot-press as the pressing machine at a temperature of 150° C. under a pressure of 1 kg/cm² for a period of 30–60 minutes. It may be otherwise carried out by means of a vacuum laminator as the pressing machine under the same heating and pressing conditions as those used for the hot-press.

When the production is effected as described above, the air locally remaining between the second surface panel 26 of the honeycomb structure 20 and the bonding material sheet 31 and between the bonding material sheet 31 and the solar battery unit 10 flows through the third perforations 32, first perforations 29, and second perforations 30 into the cavities 23 of the honeycomb structure 20. Thus, the air is not suffered to persist in the form of bubbles in the interfaces and the joining layer (bonding material sheet 31) has the thickness thereof uniformized throughout the entire area thereof.

Since the second surface panel 26 of the honeycomb structure 20 and the solar battery unit 10 are uniformly joined mutually throughout the entire interface as a result, the otherwise possible ununiform union can be precluded and the solar battery unit 10 is prevented from assuming a distorted surface but is allowed to assume a uniform and flat surface throughout the entire area thereof.

Further, since the air which has flowed into the cavities 23 of the honeycomb structure 20 is discharged to the exterior through the perforations 28 formed in the walls of the cells 22, the remaining air mentioned above is allowed to flow out with increased smoothness and the possibility of the air being entrapped in the form of bubbles in the interfaces is prevented with increased infallibility.

When the solar battery module was produced by effecting the union in the same manner as described above while omitting the formation of perforations in the second surface panel 26 of the honeycomb structure 20 and the adhesive agent layer 27, the union lacked uniformity and the surface sustained a distortion. When the solar battery unit 10 shaped like a sheet as illustrated in FIG. 3A was used, the resultant module sustained a local surface distortion in consequence of the enfoldment of bubbles formed in the interface. When the solar battery unit 10a shaped like a panel as illustrated in FIG. 3B was used, the produced module sustained an overall surface distortion because of the enfoldment of bubbles formed in the interface and on account of the uneven thickness of the joining layer.

The method of production, as depicted above, simultaneously carries out the manufacture of the honeycomb structure 20 and the union of the solar battery unit 10 thereto. It is, however, permissible to produce in advance the honeycomb structure 20 having the joining side surface thereof opened into the cavities 23 in the same manner as described above and then join the solar battery unit 10 through the medium of the bonding material sheet 31 to the second surface panel 26 of the honeycomb structure 20 by application of heat and pressure in the same manner as above.

Alternatively, it is allowable to produce the honeycomb structure 20 in advance by joining two surface panels having no perforation to the opposite opening sides of the honeycomb core respectively, form the perforations 29 in the second surface panel 26 of the honeycomb structure 20 to complete the honeycomb structure 20 having the joining side surface thereof opened into the cavities 23, and join the solar battery unit 10 through the medium of the bonding material sheet 31 to the second surface panel 26 by application of heat and pressure in the same manner as above. It has been ascertained that the solar battery module having a uniform and flat surface can be produced without inducing any surface distortion even when the formation of the third perforations 32 in the bonding material sheet 31 is omitted.

While certain specific embodiments have been disclosed herein, the invention may be embodied in other specific forms without departing from the spirit or essential characteristics thereof. The described embodiments are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

What is claimed is:

1. A method for the production of a solar battery module, comprising the steps of:

preparing a honeycomb structure possessed of a plurality of cavities by joining a first surface panel and a second surface panel to opposite opening sides of a honeycomb core possessed of a plurality of cells, placing a solar battery unit through the medium of a joining member on the second surface panel of said honeycomb structure, and joining the second surface panel and the solar battery unit with the joining member by application of heat and pressure while causing the air present between the second surface panel and the solar battery unit to flow into the cavities of said honeycomb structure.

2. The method according to claim 1, wherein the air in the cavities is discharged to the exterior during the application of heat and pressure.

3. The method according to claim 1, wherein said second surface panel has a plurality of perforations.

4. The method according to claim 1, wherein said joining member is in the shape of a sheet and has a plurality of perforations.

5. The method according to claim 1, wherein said honeycomb core has at least a pair of perforations in walls of each of the cells.

6. The method according to claim 1, wherein said honeycomb core is made of a porous material.

7. A method for the production of a solar battery module, comprising the steps of:

- placing a honeycomb core possessed of a plurality of cells on a first surface panel through the medium of a first sheet of adhesive agent in such a manner that one opening side of said honeycomb core is opposed to said first surface panel,
- placing a second surface panel possessed of a plurality of first perforations on said honeycomb core through the medium of a second sheet of adhesive agent possessed of a plurality of second perforations,
- placing a solar battery unit on said second surface panel through the medium of a joining member, and
- joining the resultant superposed layers with said sheets of adhesive agent and said joining member by application of heat and pressure.

8. The method according to claim 7, wherein said joining member is in the shape of a sheet and has a plurality of third perforations.

9. The method according to claim 7, wherein said honeycomb core has at least a pair of perforations in walls of each of the cells.

10. The method according to claim 7, wherein said honeycomb core is made of a porous material.

11. A solar battery module comprising a honeycomb structure possessed of a plurality of cavities and a solar battery unit joined to one opening side surface part of said honeycomb structure through the medium of a sheet-like joining member, said honeycomb structure being provided in the surface part thereof contacting said joining member with a plurality of perforations adapted to connect an interface between said joining member and the surface part of said honeycomb structure with said cavities and having a structure adapted to allow passage of the ambient air into said cavities.

12. The module according to claim 11, wherein said sheet-like joining member has a plurality of perforations adapted to connect an interface between the joining member and said solar battery unit with the cavities via the perforations in the surface part of said honeycomb structure.

13. The module according to claim 11, wherein said honeycomb core has at least a pair of perforations in walls of each of the cells.

14. The module according to claim 11, wherein said honeycomb core is made of a porous material.

15. A solar battery module comprising:

- a honeycomb structure comprising a honeycomb core possessed of a plurality of cells and provided with at least a pair of perforations formed one each in opposed walls of each of said cells and a first surface panel and a second surface panel respectively joined to opposite opening sides of said honeycomb core, said second surface panel being possessed of a plurality of perforations communicating with cavities in the cells of said honeycomb core; and
- a solar battery unit provided with a plurality of solar battery elements, said solar battery unit being joined to the second surface panel of said honeycomb structure through the medium of a sheet-like joining member.

16. The module according to claim 15, wherein said solar battery unit comprises a supporting sheet, a plurality of solar battery elements arrayed on said supporting sheet, and a transparent protective layer superposed on said solar battery elements in such a manner as to nip said solar battery elements in cooperation with said supporting sheet.

17. The module according to claim 15, wherein said joining member has a plurality of perforations which are matched with the perforations formed in said second surface panel of said honeycomb structure.

* * * * *